US 12,087,856 B2

(12) United States Patent
Sasaki

(10) Patent No.: US 12,087,856 B2
(45) Date of Patent: Sep. 10, 2024

(54) FIELD EFFECT TRANSISTOR

(71) Applicants: TAMURA CORPORATION, Tokyo (JP); Novel Crystal Technology, Inc., Saitama (JP)

(72) Inventor: Kohei Sasaki, Saitama (JP)

(73) Assignees: Tamura Corporation, Tokyo (JP); Novel Crystal Technology, Inc., Saitama (JP)

(*) Notice: Subject to any disclaimer, the term of this patent is extended or adjusted under 35 U.S.C. 154(b) by 0 days.

(21) Appl. No.: 18/166,062

(22) Filed: Feb. 8, 2023

(65) Prior Publication Data

US 2023/0197844 A1   Jun. 22, 2023

Related U.S. Application Data

(63) Continuation of application No. 16/651,877, filed as application No. PCT/JP2018/035725 on Sep. 26, 2018, now Pat. No. 11,616,138.

(30) Foreign Application Priority Data

Sep. 29, 2017   (JP) ................... 2017-191741

(51) Int. Cl.
  *H01L 29/78*   (2006.01)
  *H01L 29/10*   (2006.01)
  (Continued)

(52) U.S. Cl.
  CPC ...... *H01L 29/7813* (2013.01); *H01L 29/1095* (2013.01); *H01L 29/24* (2013.01); *H01L 29/41741* (2013.01); *H01L 29/8083* (2013.01)

(58) Field of Classification Search
  CPC ............. H01L 29/7813; H01L 29/1095; H01L 29/41741; H01L 29/8083; H01L 29/4236
  See application file for complete search history.

(56) References Cited

U.S. PATENT DOCUMENTS 5,365,102 A * 11/1994 Mehrotra ............ H01L 29/8725
                                              257/E29.338
5,581,100 A    12/1996 Ajit
              (Continued)

FOREIGN PATENT DOCUMENTS

CN        1458676 A    11/2003
CN      105097869 A    11/2015
              (Continued)

OTHER PUBLICATIONS

Horowitz et al., "Grain size dependent mobility in polycrystalline organic field-effect tranistsors". Synthetic Metals 12 (Year: 2001).*
(Continued)

*Primary Examiner* — Vincent Wall
(74) *Attorney, Agent, or Firm* — Scully, Scott, Murphy & Presser, PC

(57) ABSTRACT

A field-effect transistor includes an n-type semiconductor layer that includes a $Ga_2O_3$-based single crystal and a plurality of trenches opening on one surface, a gate electrode buried in each of the plurality of trenches, a source electrode connected to a mesa-shaped region between adjacent trenches in the n-type semiconductor layer, and a drain electrode directly or indirectly connected to the n-type semiconductor layer on an opposite side to the source electrode.

6 Claims, 8 Drawing Sheets

(51) Int. Cl.
  *H01L 29/24* (2006.01)
  *H01L 29/417* (2006.01)
  *H01L 29/808* (2006.01)

(56) References Cited

U.S. PATENT DOCUMENTS

| | | | | |
|---|---|---|---|---|
| 5,719,409 | A * | 2/1998 | Singh | H01L 29/66068 |
| | | | | 257/E29.066 |
| 5,763,915 | A * | 6/1998 | Hshieh | H01L 29/7813 |
| | | | | 257/334 |
| 5,877,538 | A * | 3/1999 | Williams | H01L 29/7808 |
| | | | | 257/E29.066 |
| 5,945,701 | A | 8/1999 | Siergiej et al. | |
| 6,078,090 | A * | 6/2000 | Williams | H01L 29/8725 |
| | | | | 257/334 |
| 6,291,298 | B1 * | 9/2001 | Williams | H01L 29/66734 |
| | | | | 257/E29.066 |
| 6,833,304 | B2 | 12/2004 | Yoshimochi | |
| 6,855,983 | B1 | 2/2005 | Kushida | |
| 7,009,228 | B1 * | 3/2006 | Yu | H01L 29/0619 |
| | | | | 257/256 |
| 9,437,689 | B2 | 9/2016 | Sasaki et al. | |
| 9,461,124 | B2 | 10/2016 | Sasaki et al. | |
| 9,484,392 | B2 | 11/2016 | Lee et al. | |
| 9,590,050 | B2 | 3/2017 | Hitora et al. | |
| 10,249,767 | B2 | 4/2019 | Sasaki et al. | |
| 2003/0038335 | A1 | 2/2003 | Huang et al. | |
| 2004/0007757 | A1 | 1/2004 | Yoshimochi | |
| 2004/0061114 | A1 * | 4/2004 | Yan | C23C 16/407 |
| | | | | 438/45 |
| 2006/0011962 | A1 * | 1/2006 | Kocon | H01L 29/7811 |
| | | | | 438/242 |
| 2007/0057262 | A1 * | 3/2007 | Nakamura | H01L 29/66068 |
| | | | | 257/E21.057 |
| 2012/0104467 | A1 * | 5/2012 | Li | H01L 29/1066 |
| | | | | 257/256 |
| 2013/0075789 | A1 * | 3/2013 | Kanamura | H03F 1/3247 |
| | | | | 257/E21.409 |
| 2014/0217405 | A1 | 8/2014 | Sasaki et al. | |
| 2015/0325660 | A1 | 11/2015 | Hitora et al. | |
| 2015/0340412 | A1 | 11/2015 | Lee et al. | |
| 2016/0260832 | A1 | 9/2016 | Oka et al. | |
| 2016/0365418 | A1 | 12/2016 | Sasaki et al. | |
| 2017/0133518 | A1 * | 5/2017 | Li | H01L 29/8122 |
| 2017/0200790 | A1 * | 7/2017 | Hitora | H01L 33/26 |
| 2017/0213918 | A1 | 7/2017 | Sasaki | |
| 2018/0183433 | A1 * | 6/2018 | Ojima | H03K 17/04206 |
| 2018/0350967 | A1 | 12/2018 | Sasaki et al. | |
| 2019/0148563 | A1 | 5/2019 | Sasaki et al. | |
| 2020/0066921 | A1 | 2/2020 | Sasaki et al. | |
| 2020/0168707 | A1 | 5/2020 | Shirota et al. | |
| 2021/0020789 | A1 | 1/2021 | Sasaki et al. | |

FOREIGN PATENT DOCUMENTS

| | | |
|---|---|---|
| CN | 105097896 A | 11/2015 |
| EP | 3 174 101 A1 | 5/2017 |
| JP | H11-145455 A | 5/1999 |
| JP | 2001-527296 A | 12/2001 |
| JP | 2005-501425 A | 1/2005 |
| JP | 2015-227279 A | 12/2015 |
| JP | 2016-015503 A | 1/2016 |
| JP | 2016-164906 A | 9/2016 |
| JP | 2017-112126 A | 6/2017 |
| WO | 2016013658 A1 | 1/2016 |

OTHER PUBLICATIONS

International Search Report dated Nov. 13, 2018 issued in International Application No. PCT/JP2018/035725.
Extended European Search Report dated May 17, 2021 from related EP 18861655.1.
Office Action dated Jun. 24, 2021 from parent U.S. Appl. No. 16/651,877.
Japanese Office Action dated Oct. 19, 2021 received in Japanese Application No. 2017-191741, together with an English-language translation.
Office Action dated Nov. 4, 2021 from parent U.S. Appl. No. 16/651,877.
Office Action dated Mar. 10, 2022 from parent U.S. Appl. No. 16/651,877.
Japanese Notice of Reasons for Refusal dated Apr. 19, 2022 received in Japanese Patent Application No. 2017-191741, together with an English-language translation.
Office Action dated Jul. 28, 2022 from parent U.S. Appl. No. 16/651,877.
Porter, Hugh L., "Thin Film Growth and Doping Characteristics of ZnO and f3-Ga2O3", Jan. 20, 2005, pp. 1-162, https://repository.lib.ncsu.edu/handle/1840.16/4241 (Year: 2005).
Marko J. Tadjer et al 2016 ECS J. Solid State Sci. Technol. 5 P468 (Year: 2016).
Notice of Allowance dated Nov. 18, 2022 from parent U.S. Appl. No. 16/651,877.
European Office Action dated Nov. 30, 2022 from related EP 18861655.1.
Official Action dated Jan. 12, 2023 received from the China National Intellectual Property Administration in related application CN 201880062606.4 together with English language translation.
Official Action dated Jun. 16, 2023 received from the China National Intellectual Property Administration in related application CN 201880062606.4 together with English language translation.

* cited by examiner

FIELD EFFECT TRANSISTOR

TECHNICAL FIELD

The invention relates to a field-effect transistor.

BACKGROUND ART

A $Ga_2O_3$-based trench MOSFET having a gate electrode buried in a semiconductor layer is known (see, e.g., Patent Literature 1). In general, trench MOSFETs are characterized by having a lower on-resistance than planar MOSFETs.

According to Patent Literature 1, threshold voltage is increased by using a p-type $\beta$-$Ga_2O_3$ single crystal film as a semiconductor layer in which the gate electrode is buried, as compared to using an undoped $\beta$-$Ga_2O_3$ single crystal film. For this reason, in order to obtain sufficient off-state leakage characteristics in high current power devices, the gate electrode should be buried in the p-type $\beta$-$Ga_2O_3$ single crystal film.

CITATION LIST

Patent Literature

Patent Literature 1: JP 2016/15503 A

SUMMARY OF INVENTION

Technical Problem

However, it is very difficult to produce a p-type $\beta$-$Ga_2O_3$ single crystal. Therefore, the $Ga_2O_3$-based trench MOSFET disclosed in Patent Literature 1 in which the gate electrode is buried in the p-type $\beta$-$Ga_2O_3$ single crystal film is difficult to manufacture.

It is an object of the invention to provide a $Ga_2O_3$-based field-effect transistor which is excellent in off-state leakage characteristics and breakdown voltage without using the p-type $\beta$-$Ga_2O_3$ single crystal.

Solution to Problem

To achieve the above-mentioned object, an aspect of the invention provides a field-effect transistor defined by [1] to [7] below.

[1] A field-effect transistor, comprising: an n-type semiconductor layer that comprises a $Ga_2O_3$-based single crystal and a plurality of trenches opening on one surface; a gate electrode buried in each of the plurality of trenches; a source electrode connected to a mesa-shaped region between adjacent trenches in the n-type semiconductor layer; and a drain electrode directly or indirectly connected to the n-type semiconductor layer on an opposite side to the source electrode.

[2] The field-effect transistor according to [1], wherein the gate electrode comprises a p-type semiconductor, and the gate electrode and the n-type semiconductor layer are in contact with each other to form a p-n junction.

[3] The field-effect transistor according to [1], wherein the gate electrode comprises a conductor, and the gate electrode is electrically insulated from the n-type semiconductor layer by a gate insulator film.

[4] The field-effect transistor according to [3], further comprising: a p-type semiconductor member connected to at least a part of the mesa-shaped region and to the source electrode.

[5] The field-effect transistor according to any one of [1] to [4], wherein an edge portion of the source electrode is located lateral to outermost one of the gate electrodes.

[6] The field-effect transistor according to any one of [1] to [5], wherein the mesa-shaped region has a width of not less than 0.1 μm and not more than 2 μm.

[7] The field-effect transistor according to any one of [1] to [6], wherein a distance from a surface of the n-type semiconductor layer on a side of the drain electrode to a bottom of the trenches is not less than 1 μm and not more than 500 μm.

Advantageous Effects of Invention

According to the invention, a $Ga_2O_3$-based field-effect transistor can be provided which is excellent in off-state leakage characteristics and breakdown voltage without using the p-type $\beta$-$Ga_2O_3$ single crystal.

DESCRIPTION OF EMBODIMENTS

First Embodiment (Configuration of Trench MOSFET)

Figure 1:
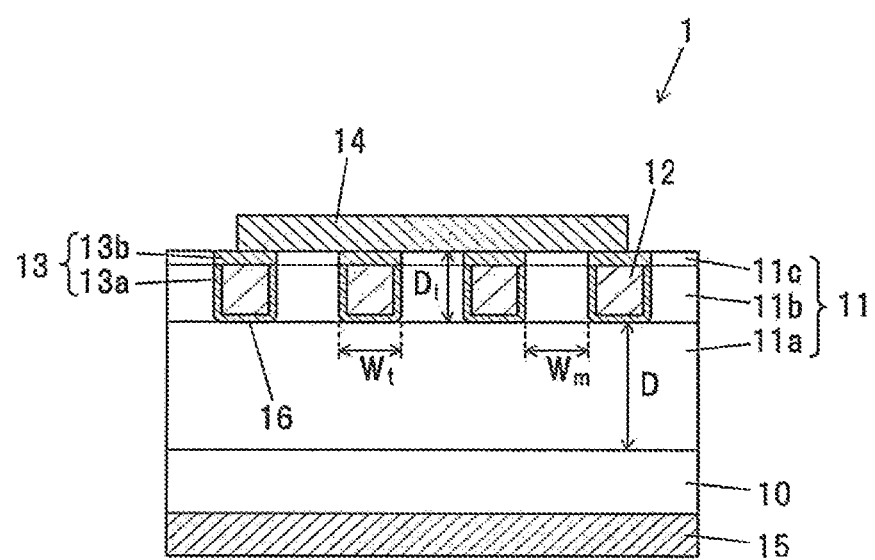
FIG. 1 is a vertical cross-sectional view showing a trench MOSFET (Metal Oxide Semiconductor Field Effect Transistor) in the first embodiment.

FIG. 1 is a vertical cross-sectional view showing a trench MOSFET (Metal Oxide Semiconductor Field Effect Transistor) 1 in the first embodiment. The trench MOSFET 1 is a vertical field-effect transistor having a trench-gate structure. The trench MOSFET 1 in the first embodiment also includes a configuration in which gate insulator films 13 (described later) are formed of a material other than oxide.

The trench MOSFET 1 is provided with an n-type semiconductor substrate 10, an n-type semiconductor layer 11 formed on the n-type semiconductor substrate 10 and having trenches 16 opening on the upper surface (a surface opposite to the n-type semiconductor substrate 10), gate electrodes 12 buried in the trenches 16 of the n-type semiconductor layer 11 in a state of being covered with gate insulator films 13, a source electrode 14 formed on the upper surface of the n-type semiconductor layer 11, and a drain electrode 15 formed on a surface of the n-type semiconductor substrate 10 on the opposite side to the n-type semiconductor layer 11.

The trench MOSFET 1 may be either normally-off or normally-on, but is usually manufactured to be normally-off in view of safety when used as a power device. It is to prevent conduction between the source electrode 14 and the drain electrode 15 in the event of power outage.

In the normally-off trench MOSFET 1, channels are formed in the mesa-shaped regions of the n-type semiconductor layer 11 between the adjacent trenches 16 when voltage of not less than threshold voltage is applied between the gate electrodes 12 and the source electrode 14, allowing a current to flow from the drain electrode 15 to the source electrode 14.

The n-type semiconductor substrate 10 is formed of an n-type $Ga_2O_3$-based single crystal containing a group IV element such as Si or Sn as a donor. The donor concentration in the n-type semiconductor substrate 10 is, e.g., not less than $1.0 \times 10^{18}$ cm$^{-3}$ and not more than $1.0 \times 10^{20}$ cm$^{-3}$. The thickness of the n-type semiconductor substrate 10 is, e.g., not less than 10 μm and not more than 600 μm.

The $Ga_2O_3$-based single crystal here means a $Ga_2O_3$ single crystal or is a $Ga_2O_3$ single crystal doped with an element such as Al or In, and may be, e.g., a $(Ga_xAl_yIn_{(1-x-y)})_2O_3$ (0<x≤1, 0≤y<1, 0<x+y≤1) single crystal which is a $Ga_2O_3$ single crystal doped with Al and In. The band gap is widened by adding Al and is narrowed by adding In. The $Ga_2O_3$ single crystal mentioned above has, e.g., a β-crystal structure.

The plane orientation of the n-type semiconductor substrate 10 is not specifically limited, but is preferably a (001) plane on which a $Ga_2O_3$-based single crystal constituting the n-type semiconductor layer 11 is formed at a high growth rate.

The n-type semiconductor layer 11 is formed of an n-type $Ga_2O_3$-based single crystal containing a group IV element such as Si or Sn as a donor.

The n-type semiconductor layer 11 has a channel layer 11b in which the gate electrodes 12 are buried and channels are formed when gate voltage is applied, a drift layer 11a provided under the channel layer 11b to maintain breakdown voltage, and a contact layer 11c formed in the vicinity of the upper surface of the n-type semiconductor layer 11 by ion implantation or epitaxial growth, etc., to provide an ohmic connection between the source electrode 14 and the n-type semiconductor layer 11.

A distance D from a surface of the n-type semiconductor layer 11 on the drain electrode 15 side (an interface between the n-type semiconductor substrate 10 and the n-type semiconductor layer 11) to the bottoms of the trenches 16 is one of parameters determining the breakdown characteristics of the trench MOSFET 1, and given that breakdown field strength of $Ga_2O_3$ stays constant at 8 MV/cm which is a value estimated from the band gap, the distance D needs to be, e.g., at least not less than about 1 to 2 μm to obtain performance of having breakdown voltage of 600V used for home appliances or in-vehicle devices, etc., not less than about 3 μm to obtain breakdown voltage of 1200V used for industrial equipment, etc., not less than about 8 to 9 μm to obtain breakdown voltage of 3300V used for large transportation equipment such as bullet train, etc., not less than about 16 to 17 μm to obtain breakdown voltage of 6600V in high power applications such as power generation and transmission, etc., not less than about 30 μm to obtain breakdown voltage of 12000V in medium-voltage circuit breakers, and not less than about 250 μm to obtain breakdown voltage of 100000V in high-voltage circuit breakers. The maximum breakdown field strength of $Ga_2O_3$ has not been able to be actually measured at the moment, and if it is about 4 MV/cm which is the largest of the actually measured values, the film thicknesses mentioned above need to be doubled. For example, about 500 μm is required to obtain breakdown voltage of 100000V. To obtain breakdown voltage of less than 600V for small home appliances, the distance D may be smaller than 1 μm but is preferably about 1 μm at minimum in view of production stability. Thus, the distance D is preferably not less than 1 μm and not more than 500 μm.

The donor concentration in the drift layer 11a is one of the parameters determining the breakdown characteristics of the trench MOSFET 1, and given that breakdown field strength of $Ga_2O_3$ stays constant at 8 MV/cm, it is preferably not more than about $3 \times 10^{17}$ cm$^{-3}$ to obtain breakdown voltage of 600V, not more than about $1.5 \times 10^{17}$ cm$^{-3}$ to obtain breakdown voltage of 1200V, not more than about $5.4 \times 10^{16}$ cm$^{-3}$ to obtain breakdown voltage of 3300V, not more than about $2.7 \times 10^{16}$ cm$^{-3}$ to obtain breakdown voltage of 6600V, not more than about $1.5 \times 10^{16}$ cm$^{-3}$ to obtain breakdown voltage of 12000V, and not more than about $2 \times 10^{13}$ cm$^{-3}$ to obtain breakdown voltage of 100000V. To obtain breakdown voltage of less than 600V or breakdown voltage of more than 6600V, the concentration is respectively set to appropriate values. In addition, when the maximum breakdown field strength of $Ga_2O_3$ is about 4 MV/cm, the concentrations are respectively not more than half of the above-mentioned values.

The donor concentration and mesa width $W_m$ of the channel layer 11b are one of the parameters determining whether the trench MOSFET 1 is normally-off or normally-on, and the lower donor concentration and the narrower mesa width $W_m$ are provided to form a normally-off device, and the higher donor concentration and the wider mesa width $W_m$ are provided to form a normally-on device. The donor concentration in the channel layer 11b for forming the normally-off device is, e.g., about $2 \times 10^{15}$ cm$^{-3}$ when having the mesa width $W_m$ of 2.0 μm, about $3 \times 10^{16}$ cm$^{-3}$ when having the mesa width $W_m$ of 0.5 μm, and about $1 \times 10^{17}$ cm$^{-3}$ when having the mesa width $W_m$ of 0.2 μm. To form a normally-on device, the higher donor concentration and the narrower mesa width $W_m$ than the above-mentioned values may be provided. The trench 16 has a depth $D_t$ of, e.g., not less than 0.1 μm and not more than 5 μm.

When the width $W_m$ of the mesa-shaped regions is smaller, the donor can be added at a higher concentration and on-resistance of the channel layer 11b can be thus more reduced. However, when the width $W_m$ is smaller, there is a problem that it is more difficult to manufacture and this causes a decrease in production yield.

For this reason, when the trenches 16 are formed by, e.g., patterning using a general stepper, the width $W_m$ of the mesa-shaped regions is preferably not less than 0.5 μm and not more than 2 μm, and when the trenches 16 are formed by patterning using EB (electron beam) lithography with higher resolution, the width $W_m$ of the mesa-shaped regions is preferably not less than 0.1 μm and not more than 2 μm.

A width $W_t$ of the trench 16 also depends on the resolution of an exposure system and is thus set within a numerical range similar to the width $W_m$ of the mesa-shaped regions according to the type of the exposure system to be used.

The thickness of the contact layer 11c is, e.g., not less than 10 nm and not more than 5 μm. The donor concentration in the contact layer 11c is higher than the donor concentration in the channel layer 11b and is, e.g., not less than $1 \times 10^{18}$ cm$^{-3}$ and not more than $1 \times 10^{21}$ cm$^{-3}$.

The gate electrode 12 is formed of a conductor, i.e., a metal such as Ni or a semiconductor containing a high concentration of a donor. The gate insulator film 13 has, e.g., a portion 13a covering the side and bottom surfaces of the gate electrode 12 and electrically insulating the gate electrode 12 from the n-type semiconductor layer 11, and a portion 13b covering the upper surface of the gate electrode 12 and electrically insulating the gate electrode 12 from the source electrode 14. The portion 13a and the portion 13b of the gate insulator film 13 are respectively formed of, e.g., $HfO_2$ and $SiO_2$. The thicknesses of the portion 13a and the portion 13b of the gate insulator film 13 are respectively, e.g., not less than 10 nm and not more than 100 nm, and not less than 50 nm and not more than 2000 nm. The breakdown-voltage performance of the trench MOSFET 1 is more improved when the material used to form the portion 13a of the gate insulator film has a higher permittivity and a larger band gap.

The n-type semiconductor layer 11 is formed of, e.g., an epitaxially grown film formed by the HYPE method, etc. When the n-type semiconductor layer 11 is formed by the HYPE method, a chloride gas is used as a source material for $Ga_2O_3$-based single crystal or a dopant source material. Therefore, the n-type semiconductor layer 11 contains Cl derived from the source material for $Ga_2O_3$-based single crystal or the dopant source material.

When using the HVPE method, it is possible to reduce film formation time and the cost since the crystal growth rate is high. This feature is advantageous particularly when forming a thick n-type semiconductor layer 11. In addition, when using the HYPE method, it is possible to form the n-type semiconductor layer 11 with good crystal quality and thus possible to improve the production yield. Furthermore, since it is possible to form the n-type semiconductor layer 11 with high purity, it is possible to accurately control the donor concentration.

The contact layer 11c may be formed by implanting a donor, using an ion implantation process, into an upper portion of the channel layer 11b formed by epitaxial growth, but the manufacturing cost can be kept low when the $Ga_2O_3$-based single crystal is formed by crystal growth while introducing a donor.

The source electrode 14 is connected to the mesa-shaped regions of the n-type semiconductor layer 11 between the adjacent trenches 16. The drain electrode 15 is directly or indirectly connected to the n-type semiconductor layer 11 on the opposite side to the source electrode 15. The drain electrode 15 is connected to a surface of the n-type semiconductor substrate 10 on the opposite side to the n-type semiconductor layer 11 in the example shown in FIG. 1, but is connected to, e.g., a surface of the n-type semiconductor layer 11 on the opposite side to the source electrode 14 when the trench MOSFET 1 does not include the n-type semiconductor substrate 10.

The source electrode 14 and the drain electrode 15 are respectively ohmic-connected to the contact layer 11c of the n-type semiconductor layer 11 and to the n-type semiconductor substrate 10. The source electrode 14 and the drain electrode 15 have, e.g., a Ti/Au stacked structure.

(Modification 1)

Figure 2:
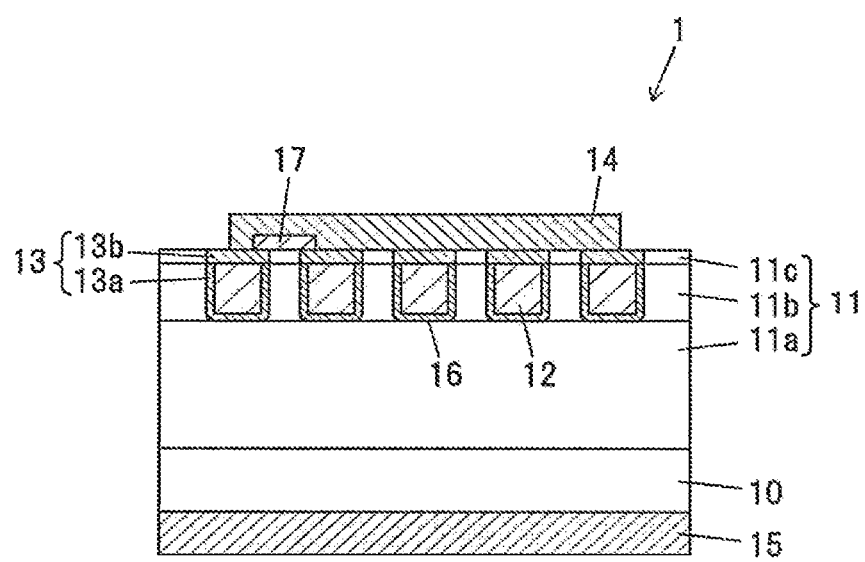
FIG. 2 is a vertical cross-sectional view showing a modification of the trench MOSFET in the first embodiment.

FIG. 2 is a vertical cross-sectional view showing a modification of the trench MOSFET 1 in the first embodiment. This trench MOSFET 1 is provided with a p-type semiconductor member 17 which is connected to at least some of the mesa-shaped regions of the channel layer 11b between the adjacent trenches 16 and to the source electrode 14 to provide protection against surges.

The p-type semiconductor member 17 is used to release the surge current caused by a lightning strike, etc. It is possible to release electrons to the outside through the drain electrode 15 and holes to the outside through the p-type semiconductor member 17 and the source electrode 14. When the p-type semiconductor member 17 is not present, it is difficult to release holes to the outside through the source electrode 14.

The p-type semiconductor member 17 is formed of a p-type semiconductor such as $Ga_2O_3$, NiO, $Cu_2O$, SnO, GaN, SiC, Si and GaAs, etc. The p-type semiconductor member 17 is constantly in contact with the n-type semiconductor layer 11 formed of a $Ga_2O_3$-based single crystal which is an oxide, and thus may be gradually oxidized when formed of a non-oxide such as Si. For this reason, the p-type semiconductor member 17 is preferably formed of an oxide such as $Ga_2O_3$, NiO, $Cu_2O$ or SnO, etc., to ensure long-term stability. In addition, since it is difficult to obtain $Ga_2O_3$ exhibiting p-type conductivity, NiO, $Cu_2O$ and SnO, etc., are particularly preferable as the material of the p-type semiconductor member 17.

The size, number and arrangement of the p-type semiconductor members 17 are not specifically limited. When the contact area between the p-type semiconductor member 17 and the n-type semiconductor layer 11 is larger, the surge current can be released more efficiently but it is more difficult for the current to flow during normal operation. Therefore, the total contact area between the p-type semiconductor member 17 and the n-type semiconductor layer 11 is preferably not less than 10% and not more than 50% of the total contact area between the source electrode 14 and the n-type semiconductor layer 11.

(Modification 2)

Figure 3:
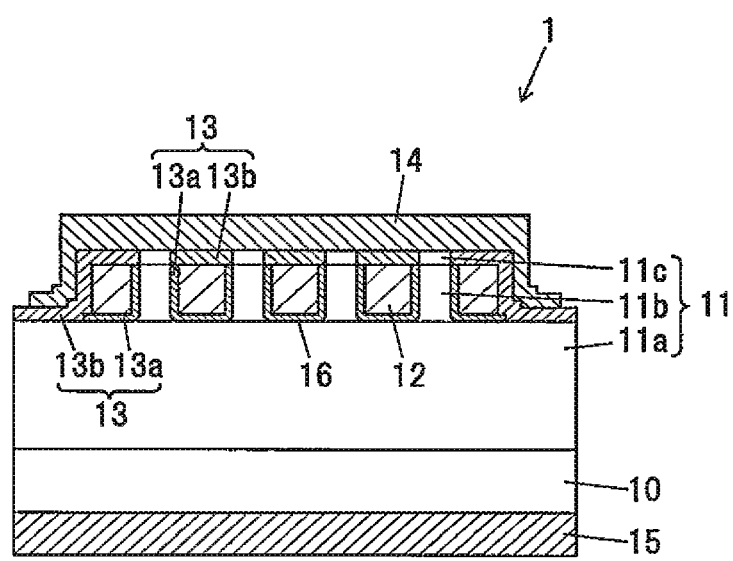
FIG. 3 is a vertical cross-sectional view showing another modification of the trench MOSFET in the first embodiment.

FIG. 3 is a vertical cross-sectional view showing another modification of the trench MOSFET 1 in the first embodiment. In this trench MOSFET 1, an outer peripheral portion of the channel layer 11b is removed and an outer peripheral portion of the source electrode 14 extends to the removed region. Thus, edge portions of the source electrode 14 are located lateral to the outermost gate electrodes 12 at a distance from the outermost gate electrodes 12.

By providing the source electrode 14 having such an edge structure, it is possible to reduce concentration of the electric field at the gate electrodes 12 closest to the edge portions of the source electrode 14 and thereby further improve breakdown voltage.

Second Embodiment

The second embodiment is different from the first embodiment in that a p-type electrode is used as the gate electrode. The explanation of the same features as the first embodiment will be omitted or simplified.

(Configuration of Trench JFET)

Figure 4:
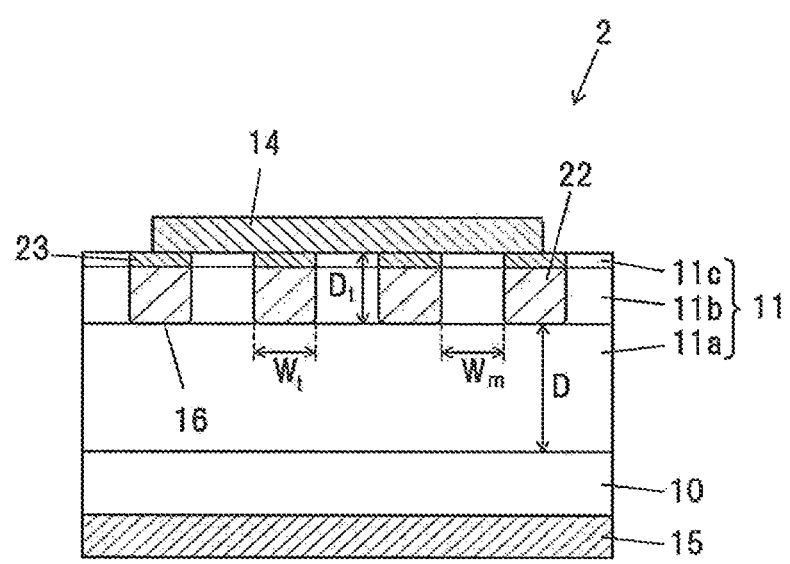
FIG. 4 is a vertical cross-sectional view showing a trench JFET (Junction Field Effect Transistor) in the second embodiment.

FIG. 4 is a vertical cross-sectional view showing a trench JFET (Junction Field Effect Transistor) 2 in the second embodiment. The trench JFET 2 is a vertical field-effect transistor having a trench-gate structure.

The trench JFET 2 is provided with the n-type semiconductor substrate 10, the n-type semiconductor layer 11 formed on the n-type semiconductor substrate 10 and having the trenches 16 opening on the upper surface (a surface opposite to the n-type semiconductor substrate 10), gate electrodes 22 buried in the trenches 16 of the n-type semiconductor layer 11 in a state of being prevented from contacting the source electrode 14 by dielectric films 23, the source electrode 14 formed on the upper surface of the n-type semiconductor layer 11, and the drain electrode 15 formed on a surface of the n-type semiconductor substrate 10 on the opposite side to the n-type semiconductor layer 11.

The trench JFET 2 may be either normally-off or normally-on, but is usually manufactured to be normally-off in view of safety when used as a power device. It is to prevent conduction between the source electrode 14 and the drain electrode 15 in the event of power outage.

In the normally-off trench JFET 2, channels are formed in the mesa-shaped regions of the n-type semiconductor layer 11 between adjacent the trenches 16 when voltage of not less than threshold voltage is applied between the gate electrodes 22 and the source electrode 14, allowing a current to flow from the drain electrode 15 to the source electrode 14.

The sizes and materials of the n-type semiconductor substrate 10, the source electrode 14 and the drain electrode 15 can be the same as those of the trench MOSFET 1 in the first embodiment. Also, the layer configuration, size, material and donor concentration of the n-type semiconductor layer 11 can be the same as those of the trench MOSFET 1 in the first embodiment.

The distance D from a surface of the n-type semiconductor substrate 10 on the drain electrode 15 side (an interface between the n-type semiconductor substrate 10 and the n-type semiconductor layer 11a) to the bottoms of the trenches 16, the depth $D_t$ of the trench 16 and the width W of the trench 16 can be the same as those of the trench MOSFET 1 in the first embodiment.

The gate electrodes 22 are formed of a p-type semiconductor and form p-n junctions with the n-type semiconductor layer 11. The gate electrodes 22 when formed of, e.g., NiO, can exhibit p-type conductivity without being doped with any dopant, but may contain an acceptor impurity such as Li.

Among NiO, SnO and $Cu_2O$, NiO is the most preferable material for the gate electrode 22 since NiO is thermodynamically stable and allows p-type electrodes to be stably obtained. It is difficult to form SnO due to the existence of $Sn_2O$ which is thermodynamically more stable than SnO. In this regard, the conductivity of $Sn_2O$ is unstable and it is difficult to control to be p-type. The conductivity of $Cu_2O$ is also unstable and it is difficult to control to be p-type.

The p-type semiconductor constituting the gate electrode 22 preferably includes an amorphous portion and is more preferably configured such that the volume of amorphous portion is higher than the volume of crystalline portion. A p-type semiconductor film containing an amorphous portion can be formed at a lower temperature than an entirely crystalline p-type semiconductor film, and thus can be manufactured easier at lower cost. In addition, by using the p-type semiconductor film containing an amorphous portion as the gate electrode 22, occurrence of leakage current can be suppressed as compared to when using the entirely crystalline p-type semiconductor film.

The diffusion potential at a junction between the gate electrode 22 formed of the p-type semiconductor and the n-type semiconductor layer 11 is often higher than the diffusion potential between the gate electrode 12 and the n-type semiconductor layer 11 in the trench MOSFET 1 in the first embodiment.

This allows the trench JFET 2 to have a wider mesa width $W_m$ than the trench MOSFET 1, hence, it is possible to reduce the degree of difficulty in manufacturing without increasing conduction losses.

However, although depending on the p-type semiconductor material to be used, the trench JFET 2 has a disadvantage in that threshold voltage is low since the p-n junction is turned on when, e.g., a positive voltage of about 2 to 5V is applied to the gate electrode 22. On the other hand, the trench MOSFET 1 has an advantage in that threshold voltage can be increased to about several V to ten and several V since the gate insulator films are present.

The dielectric films 23 are formed of, e.g., $SiO_2$. The dielectric films 23 have a thickness of, e.g., not less than 50 nm and not more than 2000 nm.

(Modification 1)

Figure 5:
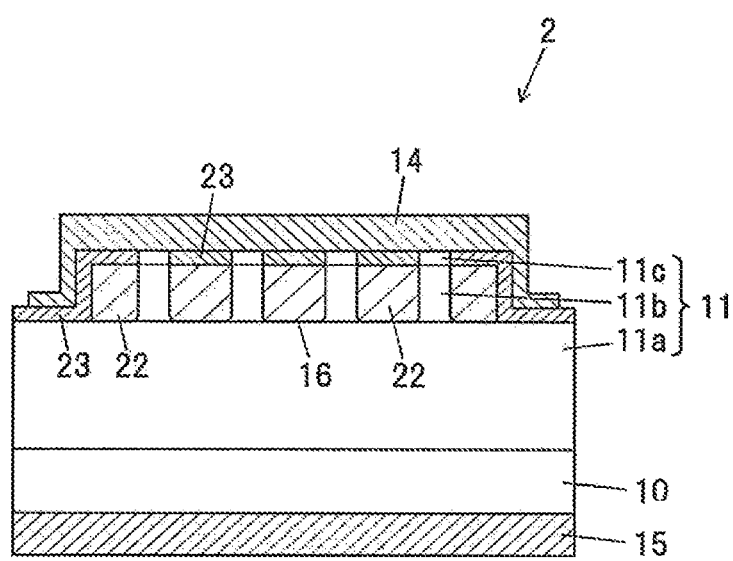
FIG. 5 is a vertical cross-sectional view showing a modification of the trench JFET in the second embodiment.

FIG. 5 is a vertical cross-sectional view showing a modification of the trench JFET 2 in the second embodiment. In this trench JFET 2, the outer peripheral portion of the channel layer 11b is removed and the outer peripheral portion of the source electrode 14 extends to the removed region. Thus, the edge portions of the source electrode 14 are located lateral to the outermost gate electrodes 22 at a distance from the outermost gate electrodes 22.

By providing the source electrode 14 having such an edge structure, it is possible to reduce concentration of the electric field at the gate electrodes 22 closest to the edge portions of the source electrode 14 and thereby further improve breakdown voltage.

Third Embodiment

The third embodiment is different from the first embodiment in the shapes of the gate electrodes and the source electrode. The explanation of the same features as the first embodiment will be omitted or simplified.

(Configuration of Trench MOSFET)

Figure 6:
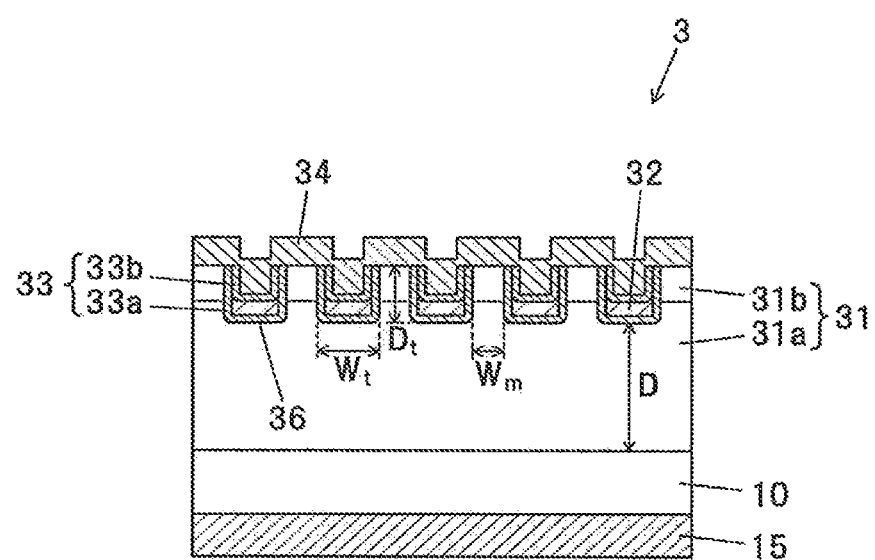
FIG. 6 is a vertical cross-sectional view showing a trench MOSFET in the third embodiment.

FIG. 6 is a vertical cross-sectional view showing a trench MOSFET 3 in the third embodiment. The trench MOSFET 3 is a vertical field-effect transistor having a trench-gate structure. The trench MOSFET 3 in the third embodiment also includes a configuration in which gate insulator films 33 (described later) are formed of a material other than oxide.

The trench MOSFET 3 is provided with the n-type semiconductor substrate 10, an n-type semiconductor layer 31 formed on the n-type semiconductor substrate 10 and having trenches 36 opening on the upper surface (a surface opposite to the n-type semiconductor substrate 10), gate electrodes 32 buried in the trenches 36 of the n-type semiconductor layer 31 in a state of being covered with gate insulator films 33, a source electrode 34 formed on the upper surface of the n-type semiconductor layer 31, and the drain electrode 15 formed on a surface of the n-type semiconductor substrate 10 on the opposite side to the n-type semiconductor layer 31.

The trench MOSFET 3 may be either normally-off or normally-on, but is usually manufactured to be normally-off in view of safety when used as a power device. It is to prevent conduction between the source electrode 34 and the drain electrode 15 in the event of power outage.

In the normally-off trench MOSFET 3, channels are formed in the mesa-shaped regions of the n-type semiconductor layer 31 between the adjacent trenches 36 when voltage of not less than threshold voltage is applied between the gate electrodes 32 and the source electrode 34, allowing a current to flow from the drain electrode 15 to the source electrode 34.

In the trench MOSFET 3, the source electrode 34 is partially located in the trenches 36, and the source electrode 34 in the trenches 36 is located on the gate electrodes 32 via the gate insulator films 33. In addition, the source electrode 34 is ohmic-connected to the mesa-shaped regions of the n-type semiconductor layer 31 between the adjacent trenches 36. The source electrode 34 has, e.g., a Ti/Au stacked structure.

The gate insulator film 33 has, e.g., a portion 33a electrically insulating the gate electrode 32 from the n-type semiconductor layer 31, and a portion 33b covering the upper surface of the gate electrode 32 and electrically insulating the gate electrode 32 from the source electrode 34. The portion 33a and the portion 33b of the gate insulator film 33 are respectively formed of, e.g., $HfO_2$ and $SiO_2$. The thicknesses of the portion 33a and the portion 33b of the gate insulator film 33 can be respectively equal to the thicknesses of the portion 13a and the portion 13b of the gate insulator film 13 in the first embodiment.

The gate electrode 32 is formed of, e.g., Cu, but may alternatively be formed of the same material as the gate electrode 12 in the first embodiment.

The n-type semiconductor layer 31 has a drift layer 31a to maintain breakdown voltage, and a contact layer 31b formed in the vicinity of the upper surface of the n-type semiconductor layer 31 by ion implantation or epitaxial growth, etc., to provide an ohmic connection between the source electrode 34 and the n-type semiconductor layer 31. The thicknesses and donor concentrations of the drift layer 31a and the contact layer 31b can be respectively equal to the thicknesses and donor concentrations of the drift layer 11a and the contact layer 11c in the first embodiment.

The distance D from a surface of the n-type semiconductor layer 31 on the drain electrode 15 side (an interface between the n-type semiconductor substrate 10 and the n-type semiconductor layer 31) to the bottoms of the trenches 36 can be equal to the distance D from a surface of the n-type semiconductor layer 11 on the drain electrode 15 side to the bottoms of the trenches 16 in the first embodiment.

In addition, the depth $D_t$ of the trench 36 and the width $W_t$ of the trench 36 can be respectively equal to the depth $D_t$ of the trench 16 and the width $W_t$ of the trench 16 in the first embodiment.

The sizes and materials of the n-type semiconductor substrate 10 and the drain electrode 15 can be the same as those of the trench MOSFET 1 in the first embodiment.

Effects of the Embodiments

According to the first to third embodiments, it is possible to provide a $Ga_2O_3$-based field-effect transistor which is formed without using a p-type β-$Ga_2O_3$ single crystal but is excellent in off-state leakage characteristics and breakdown voltage.

Example 1

Example 1 shows an example configuration of the normally-off trench MOSFET 1 with a breakdown voltage of about 650V, where voltage when a leakage current of 1 μA flows is defined as breakdown voltage.

Firstly, an example configuration when forming the trenches 16 by patterning using a general stepper is described. When the trenches 16 are formed on the channel layer 11b formed of a 0.5 μm-thick $Ga_2O_3$ layer with a donor concentration of $2.0\times10^{16}$ cm$^{-3}$ so that the width $W_m$ and the width W, are 0.5 μm, on-resistance of the channel layer 11b is about 0.25 mΩcm$^2$.

Meanwhile, the n-type semiconductor substrate 10, the drift layer 11a and the contact layer 11c, when respectively formed of a 10 μm-thick $Ga_2O_3$ substrate with a donor concentration of $1.0\times10^{16}$ cm$^{-3}$, a 2 μm-thick $Ga_2O_3$ layer with a donor concentration of $1.5\times10^{17}$ cm$^{-3}$, and a 100 nm-thick $Ga_2O_3$ layer with a donor concentration of not less than $1.0\times10^{18}$ cm$^{-3}$, respectively have on-resistance of not more than about 0.01 mΩcm$^2$, 0.08 mΩcm$^2$ and 0.001 mΩcm$^2$.

When the trench MOSFET 1 has such a configuration, on-resistance of the entire device is about 0.34 mΩcm$^2$ and breakdown voltage is about 650V.

Next, an example configuration when forming the trenches 16 by patterning using EB lithography with higher resolution than the general stepper is described. When the trenches 16 are formed on the channel layer 11b formed of a 0.5 μm-thick $Ga_2O_3$ layer with a donor concentration of $1.0\times10^{17}$ cm$^{-3}$ so that the width $W_m$ and the width $W_t$ are 0.2 μm, on-resistance of the channel layer 11b is about 0.06 mΩcm$^2$.

Meanwhile, the n-type semiconductor substrate 10, the drift layer 11a and the contact layer 11c, when respectively formed of a 10 μm-thick $Ga_2O_3$ substrate with a donor concentration of $1.0\times10^{16}$ cm$^{-3}$, a 2 μm-thick $Ga_2O_3$ layer with a donor concentration of $1.0\times10^{17}$ cm$^{-3}$, and a 100 nm-thick $Ga_2O_3$ layer with a donor concentration of not less than $1.0\times10^{18}$ cm$^{-3}$, respectively have on-resistance of not more than about 0.01 mΩcm$^2$, 0.12 mΩcm$^2$ and 0.001 mΩcm$^2$.

When the trench MOSFET 1 has such a configuration, on-resistance of the entire device is about 0.2 mΩcm$^2$ and breakdown voltage is about 650V.

Example 2

Example 2 shows an example configuration of the normally-off trench JFET 2 with a breakdown voltage of about 650V.

Firstly, an example configuration when forming the trenches 16 by patterning using a general stepper is described. When the trenches 16 are formed on the channel layer 11b formed of a 0.5 μm-thick $Ga_2O_3$ layer with a donor concentration of $3.0\times10^{16}$ cm$^{-3}$ so that the width $W_m$ and the width W, are 0.5 μm, on-resistance of the channel layer 11b is about 0.2 mΩcm$^2$.

Meanwhile, the n-type semiconductor substrate 10, the drift layer 11a and the contact layer 11c, when respectively formed of a 10 μm-thick $Ga_2O_3$ substrate with a donor concentration of $1.0\times10^{19}$ cm$^{-3}$, a 2 μm-thick $Ga_2O_3$ layer with a donor concentration of $1.5\times10^{17}$ cm$^{-3}$, and a 100 nm-thick $Ga_2O_3$ layer with a donor concentration of not less than $1.0\times10^{18}$ cm$^{-3}$, respectively have on-resistance of not more than about 0.01 mΩcm$^2$, 0.08 mΩcm$^2$ and 0.001 mΩcm$^2$.

When the trench JFET 2 has such a configuration, on-resistance of the entire device is about 0.3 mΩcm$^2$ and breakdown voltage is about 650V.

Next, an example configuration when forming the trenches 16 by patterning using EB lithography with higher resolution than the general stepper is described. When the trenches 16 are formed on the channel layer 11b formed of a 0.5 μm-thick $Ga_2O_3$ layer with a donor concentration of $1.5\times10^{17}$ cm$^{-3}$ so that the width $W_m$ and the width $W_t$ are 0.2 μm, on-resistance of the channel layer 11b is about 0.03 mΩcm$^2$.

Meanwhile, the n-type semiconductor substrate 10, the drift layer 11a and the contact layer 11c, when respectively formed of a 10 μm-thick $Ga_2O_3$ substrate with a donor concentration of $1.0\times10^{16}$ cm$^{-3}$, a 2 μm-thick $Ga_2O_3$ layer with a donor concentration of $1.5\times10^{17}$ cm$^{-3}$, and a 100 nm-thick $Ga_2O_3$ layer with a donor concentration of not less than $1.0\times10^{18}$ cm$^{-3}$, respectively have on-resistance of not more than about 0.01 mΩcm$^2$, 0.08 mΩcm$^2$ and 0.001 mΩcm$^2$.

When the trench JFET 2 has such a configuration, on-resistance of the entire device is about 0.12 mΩcm$^2$ and breakdown voltage is about 650V.

Example 3

Figure 7:
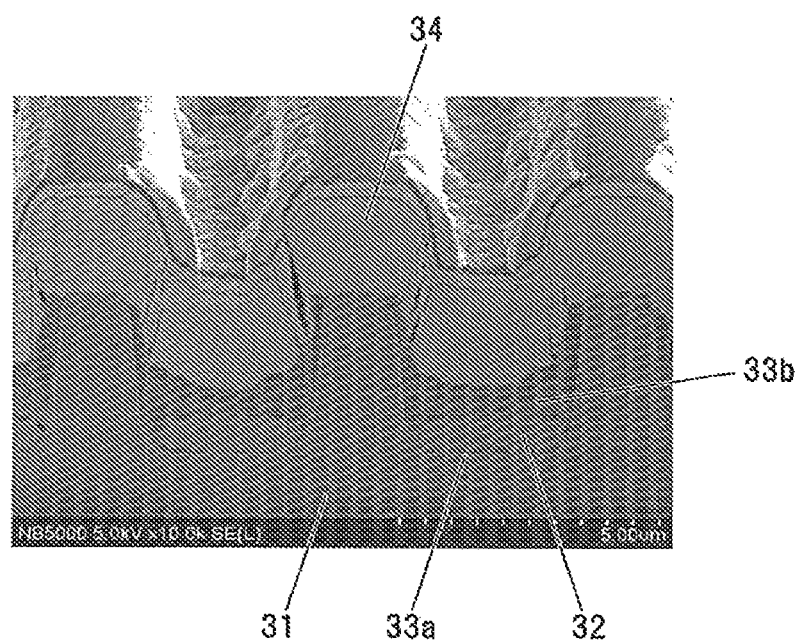
FIG. 7 is a SEM (Scanning Electron Microscope) observation image showing a cross section of a trench MOSFET in Example 3.

FIG. 7 is a SEM (Scanning Electron Microscope) observation image showing a cross section of the trench MOSFET 3 in Example 3.

The trench MOSFET 3 pertaining to FIG. 7 is normally-on, and is configured that the n-type semiconductor substrate 10, the drift layer 31*a*, the contact layer 31*b*, the gate electrode 32, the gate insulator film 33*a*, the gate insulator film 33*b*, the source electrode 34 and the drain electrode 15 are respectively formed of a 450 µm-thick Ga$_2$O$_3$ substrate with a donor concentration of $6.0\times10^{18}$ cm$^{-3}$, a 5 µm-thick Ga$_2$O$_3$ layer with a donor concentration of $3\times10^{16}$ cm$^{-3}$, a 2 µm-thick Ga$_2$O$_3$ layer with a donor concentration of $3\times10^{18}$ cm$^{-3}$, a Cu electrode with a thickness of 1 µm (in the vertical direction), a 50 nm-thick HfO$_2$ film, a 300 nm-thick SiO$_2$ film, a 3 µm-thick Ti/Au source electrode, and a 0.3 µm-thick Ti/Au drain electrode. In addition, the trenches 36 are formed so that the depth D$_t$, the width W$_m$ and the width W, are respectively 4 µm, 2 µm and 4 µm.

Figure 8A:
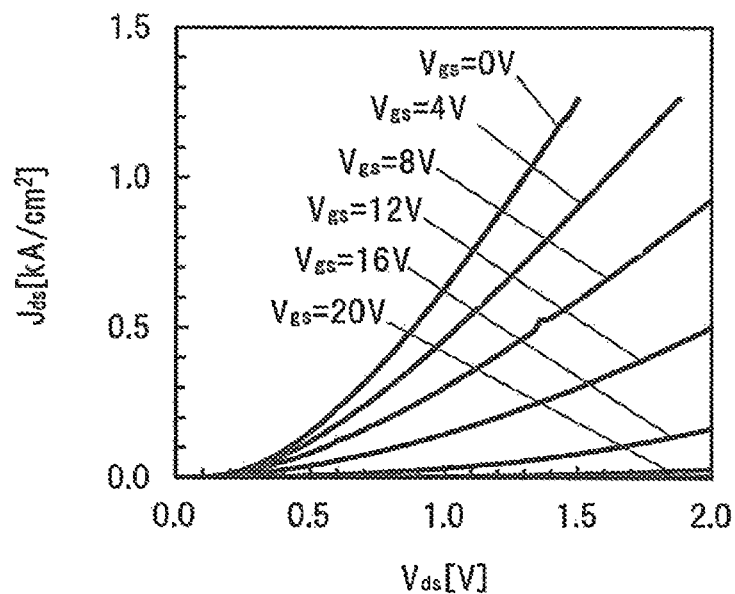
FIG. 8A is a graph showing DC characteristics of the trench MOSFET pertaining to FIG. 7.
Figure 8B:
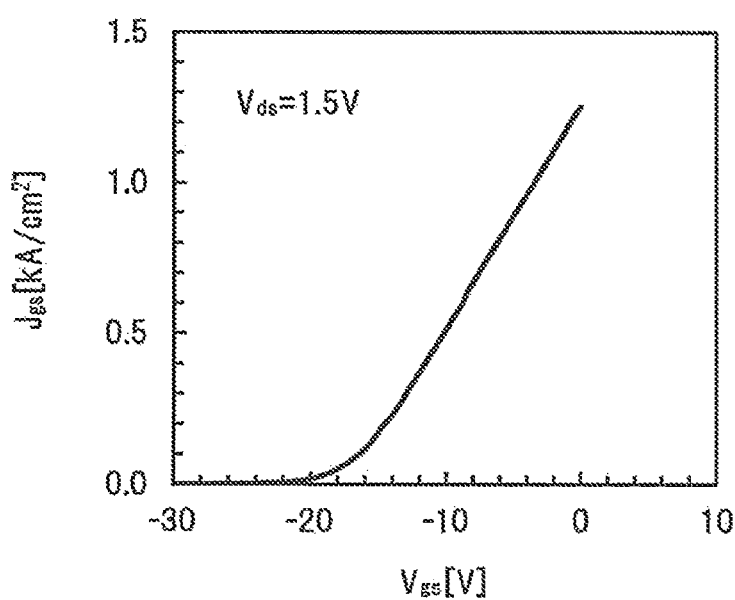
FIG. 8B is a graph showing transfer characteristics of the trench MOSFET pertaining to FIG. 7.

FIGS. 8A and 8B are graphs respectively showing DC characteristics and transfer characteristics of the trench MOSFET 3 pertaining to FIG. 7.

FIG. 8A is a graph showing a relation between voltage V$_{ds}$ and current density J$_{ds}$ both obtained between the drain electrode 15 and the source electrode 34, and shows curved lines obtained when voltage V$_{gs}$ between the gate electrode 32 and the source electrode 34 is 0V, 4V, 8V, 12V, 16V, 20V, 24V and 28V. The curved lines at the voltage V$_{gs}$ of 24V and 28V substantially overlap with the horizontal axis. In addition, J$_{ds}$ is normalized by the area of the mesa top portion.

Based on FIG. 8A, it is understood that on-resistance between the drain electrode 15 and the source electrode 34 at the voltage V$_{gs}$ of 0V is about 0.8 mΩcm$^2$.

Although the embodiments and Examples of the invention have been described, the invention is not intended to be limited to the embodiments and Examples, and the various kinds of modifications can be implemented without departing from the gist of the invention.

In addition, the invention according to claims is not to be limited to the embodiments and Examples described above. Further, it should be noted that all combinations of the features described in the embodiments and Examples are not necessary to solve the problem of the invention.

INDUSTRIAL APPLICABILITY

Provided is a Ga$_2$O$_3$-based field-effect transistor which is formed without using a p-type β-Ga$_2$O$_3$ single crystal but is excellent in off-state leakage characteristics and breakdown voltage.

REFERENCE SIGNS LIST

1 Trench MOSFET
2 Trench JFET
10 n-Type Semiconductor Substrate
11 n-Type Semiconductor Layer
11*a* Drift Layer
11*b* Channel Layer
11*c* Contact Layer
12, 22 Gate Electrode
13 Gate Insulator Film
14 Source Electrode
15 Drain Electrode
16 Trench
17 p-Type Semiconductor Member

What is claimed is:

1. A trench junction field-effect transistor without using a p-type Ga$_2$O$_3$-based single crystal, comprising:
   an n-type semiconductor layer comprising an n-type Ga$_2$O$_3$-based single crystal and having a plurality of trenches opening on one surface;
   a gate electrode buried in each of the plurality of trenches;
   a source electrode connected to a mesa-shaped region between adjacent trenches in the n-type semiconductor layer comprising the n-type Ga$_2$O$_1$-based single crystal; and
   a drain electrode directly or indirectly connected to the n-type semiconductor layer comprising the n-type Ga$_2$O$_3$-based single crystal on an opposite side to the source electrode,
   wherein the gate electrode is buried in each of the trenches in a state of being prevented from contacting the source electrode by a dielectric film,
   wherein the trench junction field-effect transistor does not include a region having a p-type Ga$_2$O$_3$-based single crystal,
   wherein the gate electrode comprises a p-type semiconductor, and
   wherein the gate electrode comprising the p-type semiconductor and the n-type semiconductor layer comprising the n-type Ga$_2$O$_3$-based single crystal are in contact with each other to form a p-n junction.

2. The field-effect transistor according to claim 1, wherein the p-type semiconductor is NiO.

3. The field-effect transistor according to claim 1, wherein an edge portion of the source electrode is located lateral to an outermost one of the gate electrodes.

4. The field-effect transistor according to claim 1, wherein the mesa-shaped region has a width of not less than 0.1 µm and not more than 2 µm.

5. The field-effect transistor according to claim 1, wherein a distance from a surface of the n-type semiconductor layer on a side of the drain electrode to a bottom of the trenches is not less than 1 µm and not more than 500 µm.

6. The field-effect transistor according to claim 1, wherein the n-type semiconductor layer comprises a channel layer in which the gate electrode is buried, a drift layer provided under the channel layer, and a contact layer provided on the channel layer and being in ohmic contact with the source electrode.

* * * * *

UNITED STATES PATENT AND TRADEMARK OFFICE
CERTIFICATE OF CORRECTION

PATENT NO. : 12,087,856 B2
APPLICATION NO. : 18/166062
DATED : September 10, 2024
INVENTOR(S) : Kohei Sasaki Page 1 of 1

It is certified that error appears in the above-identified patent and that said Letters Patent is hereby corrected as shown below:

In the Specification

Column 5, Line 18 should read:
epitaxially grown film formed by the HVPE method, etc.

Column 5, Line 20 should read:
HVPE method, a chloride gas is used as a source material for Column 5, Line 29 should read:
when using the HVPE method, it is possible to form the In the Claims Column 12, Claim 1, Line 24 should read:
layer comprising the n-type $Ga_2O_3$ based single crys- Signed and Sealed this
Fourth Day of February, 2025

Coke Morgan Stewart
*Acting Director of the United States Patent and Trademark Office*